United States Patent [19]
Jacobs et al.

[11] Patent Number: 5,450,029
[45] Date of Patent: Sep. 12, 1995

[54] CIRCUIT FOR ESTIMATING A PEAK OR RMS VALUE OF A SINUSOIDAL VOLTAGE WAVEFORM

[75] Inventors: Mark E. Jacobs, Dallas; Richard W. Farrington, Mesquite; William P. Wilkinson, Rockwall, all of Tex.

[73] Assignee: AT&T Corp., Murray Hill, N.J.

[21] Appl. No.: 83,747

[22] Filed: Jun. 25, 1993

[51] Int. Cl.⁶ .............................. G06F 7/556
[52] U.S. Cl. .................... 327/348; 327/355; 327/358; 327/359; 327/361; 327/562; 327/563; 327/336; 327/339; 327/345
[58] Field of Search ............ 307/261, 264, 490, 493, 307/494, 529, 350; 328/13, 22, 28, 127, 142, 144; 327/349, 345, 336, 339, 355, 358, 359, 361, 560, 561, 562, 563

[56] References Cited

U.S. PATENT DOCUMENTS

| | | | |
|---|---|---|---|
| 3,543,288 | 11/1970 | Collings | 328/144 |
| 3,681,700 | 8/1972 | Rennick | 328/144 |
| 4,005,283 | 1/1977 | Rhodes | 328/144 |
| 4,222,096 | 9/1980 | Capewell | 363/44 |
| 4,412,277 | 10/1983 | Mitchell | 363/81 |

(List continued on next page.)

FOREIGN PATENT DOCUMENTS

474471A2  3/1992  European Pat. Off.

OTHER PUBLICATIONS

"Power Factor Correction with the UC3854," Unitrode Application Note, C. de S. e Silva, 1991.
"High Power Factor Preregulators for Off-Line Power Supplies," Unitrode "Switching Regulator Power Supply Design Seminar Manual", Lloyd Dixon, Paper 12, 1991.
"High Power Factor Switching Preregulator Design Optimization," Unitrode Switching Regulator Power Supply Design Seminar Manual, Lloyd Dixon, Paper 13, 1991.
"Fast Controllers for High Power Factor AC-DC Converters," Proceedings of IEEE, Stankovic, Verghese, Liu, Thottuvelil, Firenze, 1991.
"A Digital Controller for a Unity Power Factor Controller," Workshop on Computers in Power Electronics, Mitwalli, Leeb, Verghese, Thottuvelil, Berkeley, Calif., Aug., 1992.
"Linear System Theory and Design", C. T. Chen, 1984, p. 354.
"High Speed Control of Sinusoidal Input Current Con-
(List continued on next page.)

*Primary Examiner*—Timothy P. Callahan
*Assistant Examiner*—Trong Phan
*Attorney, Agent, or Firm*—Alfred G. Steinmetz

[57] ABSTRACT

An estimating circuit for application in estimating or deriving the value $V_{rms}^2$ or $V_{peak}^2$, of a line voltage $V_{AC}$ provides fast response time and a substantially ripple free value for these signals by the utilization of a controlled harmonic oscillator whose output precisely tracks the input voltage waveform. Two out of phase (by $\pi/2$) sine wave signals are derived from the input sine wave and these two out of phase signals are summed to derive or estimate the desired square of the sine waveform signal at a fast response time while substantially excluding ripple of the estimated out of phase sine waves. An estimating circuit, described herein, comprises two integrator circuits series connected into a substantially closed loop. The output of the second integrator circuit is fed back to the input of the first integrator circuit. The output of each individual integrator circuit is a voltage sine wave separated in phase from the output of the other integrator by $\pi/2$ and in synchronism with the input substantially sine wave voltage $V_{AC}$. The output of each of the integrator circuits is squared in an associated squaring circuit. Each output of one of the two squaring circuits is summed with the output of the other squaring circuit to produce the desired value of $V_{peak}^2$ or $V_{rms}^2$.

10 Claims, 4 Drawing Sheets

U.S. PATENT DOCUMENTS

| | | | |
|---|---|---|---|
| 4,435,677 | 3/1984 | Thomas | 328/144 |
| 4,585,961 | 4/1986 | Daubert | 328/144 |
| 4,677,366 | 6/1987 | Wilkinson et al. | 323/222 |
| 4,835,421 | 5/1989 | Khoury et al. | 328/144 |
| 5,315,260 | 5/1994 | Link et al. | 328/28 |

OTHER PUBLICATIONS verters for Minimal Energy Storage Requirements", B. Carsten, PCIM, Sep. 1987, pp. 196–303.

"Optimum Input and Output Filters for a Single-Phase Rectifier Power Supply," S. B. Dewan, IEEE Tr. Ind. App., vol. 1A-17, No. 3 May/Jun., 1981, pp. 282–208.

"Kalman Filter Based High Speed Measurement and Control of AC Voltages for UPS Application", Sivakumer, S., Nataram, K., pp. 907–912.

IEEE Tr. Instrumentation and Measurement, vol. 1M-34, No. 3, Sep. 1985, pp. 413–417, "Microprocessor Implementation of a Fast and Simultaneous Amplitude and Frequency Detector for Sinusoidal Signals", Mahmood, M. K., Allos, J. E., Abdul-Karim, M. A. H.

IEEE Tr. on Industrial Electronics, vol. 39, No. 1, Feb. 1992, pp. 74–79, "Transient Response of a Peak Voltage Detector for Sinusoidal Signals", Chu, H-Y., Jou, H-Y., Huang, C-L.

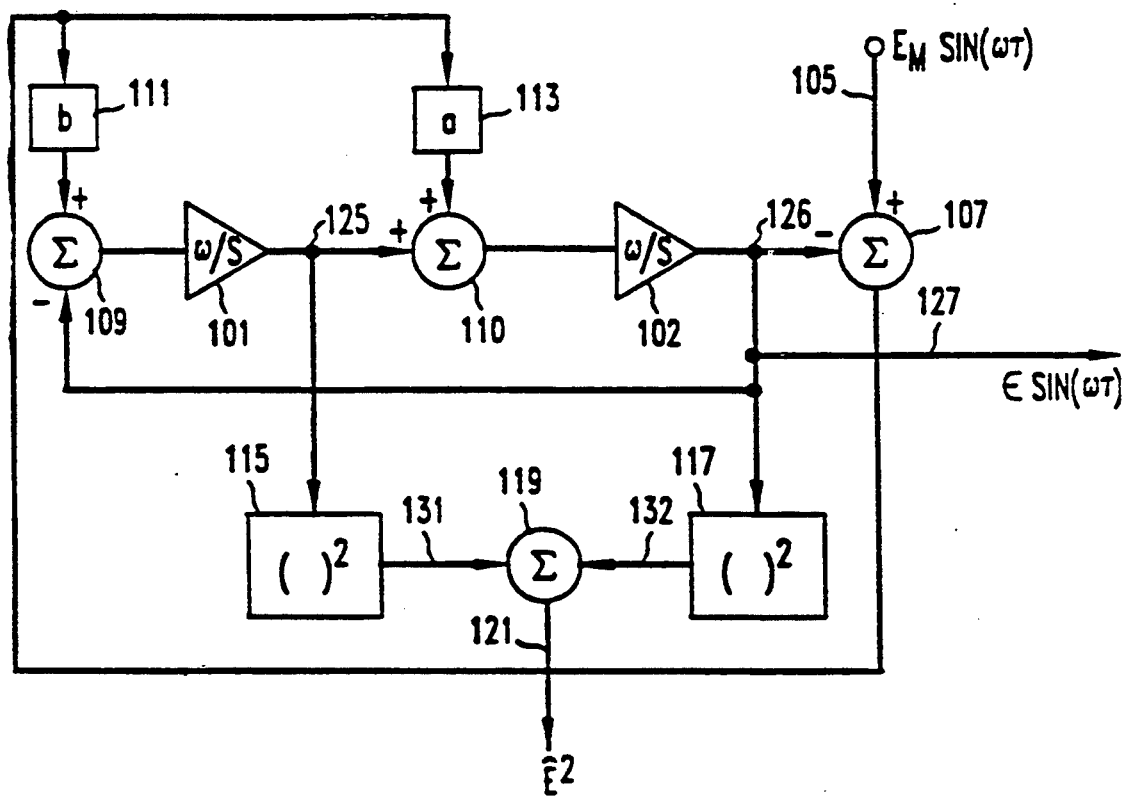
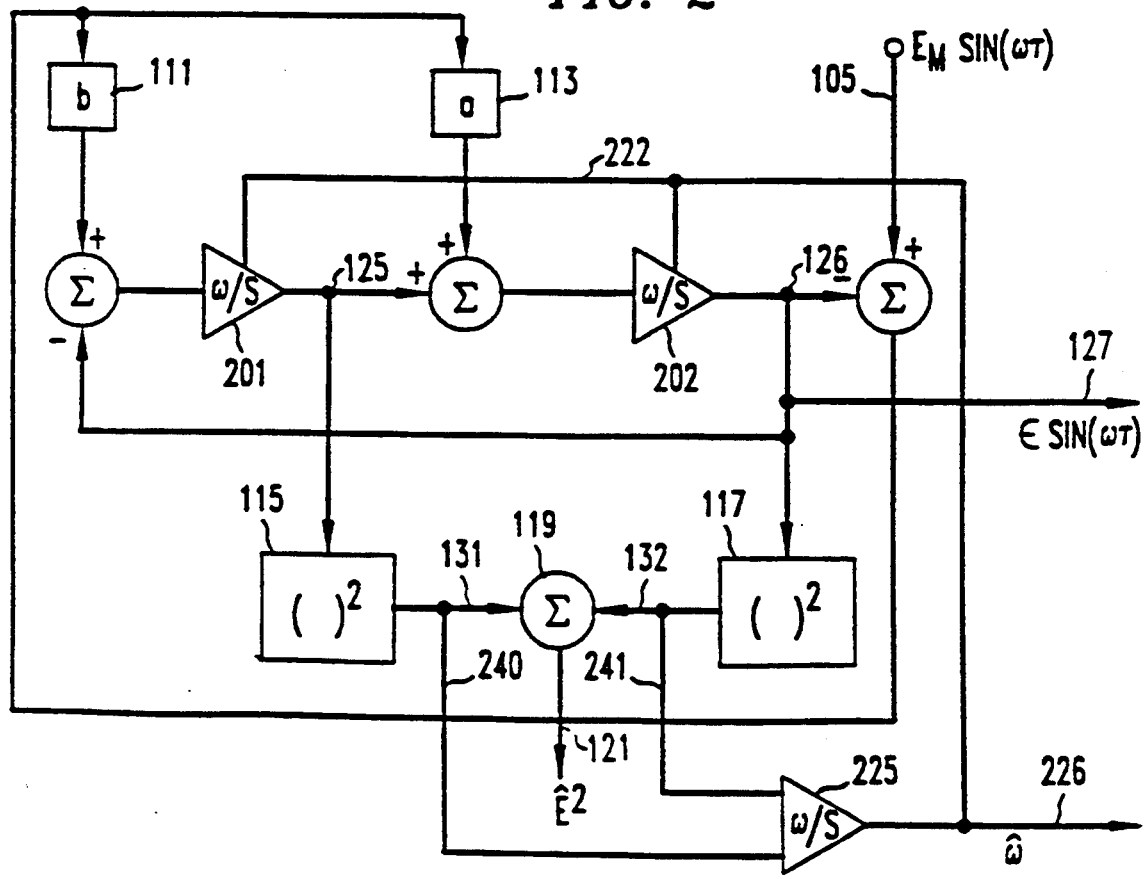
FIG. 2

CIRCUIT FOR ESTIMATING A PEAK OR RMS VALUE OF A SINUSOIDAL VOLTAGE WAVEFORM

FIELD OF THE INVENTION

This invention relates to signal estimation circuits and in particular to a signal sensing and estimation circuit for application to a power factor enhancement circuit included in a power supply circuit operating from an AC line supplying a sinusoidal or nearly sinusoidal voltage waveform.

BACKGROUND OF THE INVENTION

Power supplies operating directly off of an AC line typically comprise an input rectifier to convert the input AC line voltage to a DC voltage. This DC voltage is typically applied to a charge storage capacitor which is connected to the input of a DC/DC converter, which conveys this DC voltage to a DC voltage of another level at its output. The operating characteristics of the rectifier and storage capacitor inherently distort the input current waveform at the input to the rectifier. This waveform distortion causes harmonics to be fed back onto the AC line and further leads to significant EMI emissions and to unnecessary power losses in the AC distribution circuitry.

In other applications power supplies may operate directly off of an AC line to drive a frequency changer to provide a signal at a different frequency from that on the AC line. The input waveform may be distorted leading to the difficulties described above.

The distortion of the input current waveform may be controlled by using an active power factor controller and a converter, such as a boost converter, inserted between the rectifier and the storage capacitor to actively control the input current waveform. The active switching device is controlled in response to a control circuit that monitors the input voltage waveform. The control modulates the conduction intervals at a high frequency compared with the AC line frequency, so that the wave form of the input current is constrained to conform to that of the input voltage waveform or to the fundamental sinusoidal waveform of that input voltage waveform.

Active power factor control networks typically sense input and output signal parameters of the power circuit and utilize a power switch selectively switched or pulse width modulated in response to these signal parameters to force the input current to conform to a desired current waveform. In a particular illustrative arrangement disclosed in U.S. Pat. No. 4,412,277 a rectified input voltage waveform is multiplied with an error voltage representing the deviation of the output voltage from a regulated value. The resulting control signal is properly scaled and used to control the modulating pulse driving the power switch to provide the desired input current waveform. In a more sophisticated power factor control arrangement disclosed in U.S. Pat. 4,677,366 a feedforward control is added to compensate for rapid change in the rms input AC voltage. This is used to inversely scale the programmed input current by the square of the rms input voltage.

A limitation with these existing arrangements is the effect of ripple existing in the sensed voltage waveforms which have undesirable effects in the operation of the control circuitry resulting in an inaccurate determination of the waveform of the programmed input current. At present techniques to deal with this ripple current lengthen the response time of the power factor correction circuitry resulting in substantial transient signals in the output voltage unless a large output charge storage capacitor is used.

The success of the controller in generating the correct current waveform is dependent on the speed and accuracy with which it derives or estimates the $V_{rms}^2$ or equivalently the $V_{peak}^2$ of the input voltage for use by the controller in controlling the boost converter's active power switch. This quantity has traditionally been derived by full-wave rectifying the input AC sine wave, filtering the rectified sine wave and squaring the filtered signal. While this technique has the advantage of simplicity of circuitry and of its inherent operation, it has the disadvantage of requiring a design trade off between ripple in the derived squared voltage and the speed with which the circuit can respond to dynamic changes in the input voltage.

SUMMARY OF THE INVENTION

An estimating circuit for application in estimating or deriving the value $V_{rms}^2$ or $V_{peak}^2$ (e,cir $\hat{E}\times)^2$ of a line voltage $V_{AC}$ $(Em \sin (\omega t))$ provides fast response time and a substantially ripple free value for these signals by the utilization of a controlled harmonic oscillator whose output tracks the fundamental of the input voltage waveform. Two out of phase (out of phase by $\pi/2$) sine wave signals are derived from the input sine wave, and these two out of phase signals are squared and summed to derive or estimate the desired square of the peak of the sine waveform signal with a fast response time.

The estimating circuit, according to an illustrative embodiment of the invention, comprises two integrators, with gain, series connected into a substantially closed loop. The output of the second integrator is summed with the sensed AC line sinusoidal waveform $V_{AC}$ and fed back to the input of at least one of the two integrators. The output of each individual integrator is a voltage sine wave separated in phase from the output of the other integrator by $\pi/2$ and in synchronism with the input substantially sine wave voltage $V_{AC}$. The output of each of the integrators is squared in an associated squaring circuit. Each output of one of the two squaring circuits is summed with the output of the other squaring circuit to produce the desired value of $V_{peak}^2$ or $V_{rms}^2$.

For rectifiers designed to operate in a particular country, the AC line frequency, usually 50 Hz or 60 Hz, is known accurately and the estimating circuit described above operates with this knowledge of frequency. However for estimating circuits designed to operate in applications with an uncertain line frequency without circuit adjustment, an adaptive feedback loop may be added to the estimating circuit, in accord with the invention, to accommodate different or varying line frequencies.

In accord with the invention this estimating circuit is included in the control of a power factor control system and is utilized to generate substantially ripple free estimates of control input parameters ($V_{peak}^2$ and signal frequency) and by the use of substantially ripple free signals controls a boost, buck, SEPIC or other related type converter to enhance the power factor at the input to a rectifier circuit powered directly off of an AC line. In addition the output of the integrator, whose output is in phase with the input AC voltage, can also be used as a control input signal, closely representative of the ideal AC input voltage waveform, for controlling the power factor controller to reduce input harmonics in order to reduce distortion of the input AC line voltage by the rectifier.

Functionally equivalent variations of this peak-squared estimating circuit may be designed by taking linear transformations of the process described above. For example, circuit variations can be readily designed in which the gains of the integrators are not equal, or the phases of the derived sinusoidal signals are not separated by $\pi/2$. To produce a ripple-free estimate of the square of the peak of the AC input voltage now requires a more generalized quadratic operation in which products of the signals are used as well as squares of the signals with unequal gains. These derived circuits nonetheless are functionally equivalent to the basic circuit described above.

Additionally, the process described above can be implemented with digital computation, or with a hybrid approach in which a combination of digital computation and analog circuitry is used.

BRIEF DESCRIPTION OF THE DRAWING

In the Drawing:

FIG. 1 is a functional schematic of an estimating circuit for determining a magnitude of a peak square value of an applied AC voltage and a signal closely representative of the ideal sinusoidal AC input voltage;

FIG. 2 is a functional schematic of an estimating circuit for determining a frequency of a fundamental sinusoid of an applied AC voltage in addition to the signals derived in the circuitry of FIG. 1;

DETAILED DESCRIPTION

Figure 3:
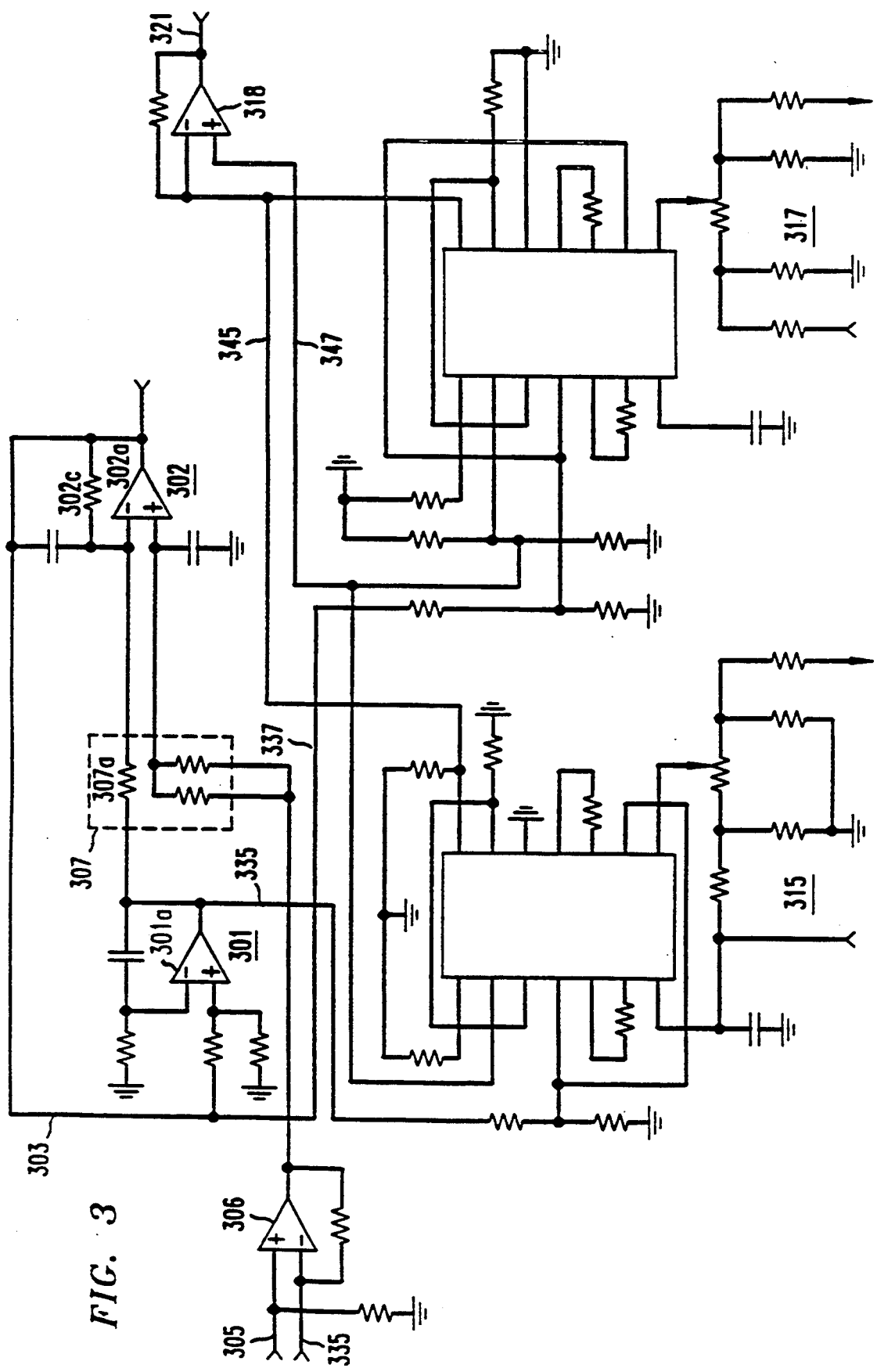
FIG. 3 is a schematic of an illustrative estimating circuit embodied in a structure suitable for application to the power factor control rectifier circuits powered off of an AC line.

The estimating circuit of FIG. 1 includes first and second integrators 101 and 102 connected in series and within a substantially closed feedback loop 103 to form a controlled harmonic oscillator. The term "controlled harmonic oscillator" as used herein refers to an oscillator producing a sine wave oscillatory signal at a controlled amplitude and phase. A substantially sinusoidal AC voltage waveform is applied to the input terminal 105.

The two integrators 101 and 102 may comprise operational amplifiers connected as integrators with each having the gain $\omega$. The value for $\omega$ is determined by the angular frequency of the fundamental of the input sinusoidal AC voltage waveform. Each of these integrators 101 and 102 integrates the volt-second value of a sinusoidal waveform applied to its input. Equivalent circuits (i.e. digital, hybrid circuits etc) capable of integrating the volt-second value of an input voltage waveform may be used.

These integrators 101 and 102 are connected in cascade and hence the output of the integrator 102 is the integral of the sinusoidal input of the integrator 101 and hence in phase with the input sinusoidal voltage waveform applied to the input lead 105. The output of the integrator 102 is summed with the AC sinusoidal voltage appled to the input lead 105.

This output of the second integrator 102 signal is applied, with opposite sign, to the input of the first integrator 101 which forms the closed feedback loop of a controlled harmonic oscillator.

The input sinusoidal signal, on lead 105, and the output of integrator 102 is summed in a summing circuit 107 and the resultant sum is applied to two gain circuits 111 and 113. These gain circuits are included to permit the output of of the integrator 102 to track with a fast time response the amplitude and phase of the fundamental of the input AC voltage. The gain of the gain circuits 111 and 113 ( "a" and "b") are selected to control the time response of the controlled harmonic oscillator (e.g. the two series connected integrators 101 and 102 with feedback loop 103) by controlling the location of the estimator's (i.e. observer's) poles. Suitable values, for the illustrative embodiment, may be a=1 and b=0. These values are illustrative and may not be optimal for particular applications.

The output of the summing circuit 107 is applied with the gain b (assuming that "b" is a finite value other than zero) of gain circuit 111 to the summing circuit 109 where it is summed with the output of integrator 102 and the sum applied to the input of integrator 101. If "b" is equal to zero this is an open connection and no gain is applied to the integrator 102. The gain "b" might not be set to zero in order to adjust the form of the transient response of the controlled harmonic oscillator. An appropriate selection of values for the gains "a" and "b" will be apparent to those skilled in the art and need not be discussed herein in detail. The output of the integrator 101 is applied to the summing circuit 110 which sums it with the output of integrator 102 as amplified by the gain of the gain circuit 113. The output of the summing circuit is applied to the input of integrator 102.

The desired resultant signals occurring at the nodes 125 and 126 are two sinusoidal signals at the fundamental frequency and displaced in phase by $\pi/2$ from each other. These two sinusoidal signals at nodes 125 and 126 are applied to the squaring circuits 115 and 117 which provide the amplitude of the two sinusoidal signals as an algebraic squared value.

The outputs of the squaring circuits 115 and 117 are applied to the summing circuit 119, which produces a pure algebraic signal magnitude representing a square of the peak of the input sinusoid voltage waveform, applied to lead 105, on output lead 121. This output magnitude on output lead 121 represents the value $V_{peak}^2$ of the fundamental of the input voltage $V_{AC}$ without any significant imposed ripple. Derivation of this magnitude by the estimating circuitry is due to the trigonometric relation $$\cos^2(\theta) + \sin^2(\theta) = 1$$

for any value of $\theta$ which is functionally incorporated within the circuitry.

This circuit is extended in FIG. 2 to derive the fundamental frequency of the input $V_{AC}$ signal applied to the input lead 105. In this arrangement the outputs of the two squaring circuits 115 and 117 are connected, via leads 240 and 241, to an integrator 225. These outputs are combined in the integrator 225 which is designated as having the gain "d" selected to provide a long response time, typically one second or longer. This integration in conjunction with adjustment of the gains of the integrators 101 and 102 extracts the value of the fundamental frequency $\omega$ of the input $V_{AC}$ and supplies this value on the output lead 226. This value $\omega$ is fed back to the integrators 201 and 202, via lead 222.

The value of the gains "a" and "b" selected for the gain circuits 211 and 213 are selected, in the illustrative embodiment, to adjust the transient response time and transient characteristics of the controlled harmonic oscillator.

As shown an output lead 227 is provided to extract the value of the fundamental sine waveform ($\epsilon$ sin ($\omega$t)) directly from the output of the integrator 202. This fundamental value is useful in some forms of control used in power factor enhancement.

An illustrative implementation of the peak estimating circuit of FIG. 1, using conventional analog circuit components, is shown schematically in the FIG. 3. The circuit of FIG. 3 includes the two operational amplifiers 301a and 302a each having the appropriate feedback circuitry to enable them to operate as the integrators 301 and 302 and further being interconnected with each other in a closed loop, by feedback loop 303, to form a controlled harmonic oscillator.

The sinusoidal line voltage is applied to the input terminals 305 and 335 and is coupled, via the operational amplifier 306, to the integrator 302, via a resistor network 307, which operates to sum this voltage with the output of the integrator 301, as applied to operational amplifier 302a of the integrator 302 via a resistor 307a which is part of the summing circuit 307. These resistors in combination with feedback circuit 302c of the operational amplifier 302a perform the desired summing and integration functions.

The circuit includes two commercially available multiplier chips 315 and 317, (e.g. MC 1495) which are externally connected to multiply an applied signal with itself and hence square it. Specifics of this connection are dictated by the multiplier chip data sheet and are not herein discussed. The multiplier chip 315 is responsive to the output of the integrator 301 supplied to it via lead 335. The multiplier chip 317 receives its input from the integrator 302, via lead 337 from the integrator 302. The output of the multiplier chips 315 and 317 are coupled via the leads 345 and 347 to the summing circuit 319 (e.g an operational amplifier connected to sum two inputs) which supplies the desired peak squared value of the fundamental of the input sinusoidal input voltage on output lead 321.

Figure 4:
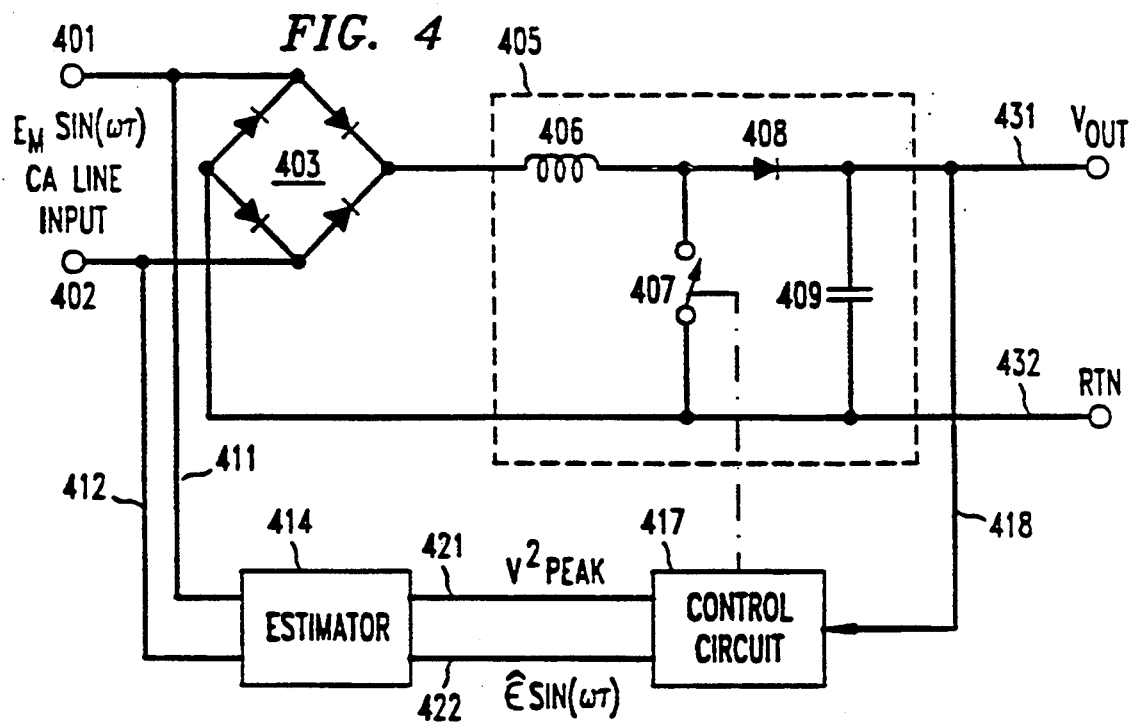
FIG. 4 is a schematic of an illustrative rectifier powered off of an AC line using such an estimating circuit in a power factor control circuit.

Application of the estimating circuit of FIG. 1 is shown in schematic form in the FIG. 4 which shows a representative power factor enhancement system. The power factor enhancement system includes a rectifier 403, a boost converter 405 and a control circuit 417 responsive to the input from an estimator such as is shown in the FIGS. 1 or 2. The input AC voltage is applied to the input terminals 401 and 402 and full wave rectified by the rectifier 403. The rectified signal is applied to the boost converter which includes an inductor 406, a controlled power switch 407, a rectifying diode 408 and a charge storage capacitor 409. The power switch is activated under control of a control circuit 417 to pulse width modulate the rectified sine wave so that the input current waveform is constrained to track the fundamental sine wave of the input AC voltage applied to the input terminals 401 and 402. The sine wave current is applied to the storage capacitor 409 and the output terminals 431 and 432.

The input AC voltage is sensed by the estimator 414, via the sensing leads 411 and 412. The estimator 414 derives a peak squared voltage on lead 421 and optimally a fundamental sine wave signal on lead 422 in the manner described above. The output voltage of the boost convert 405 is also applied to the control circuit via lead 418. These three input signals enable the control circuit to pulse width modulate the power switch 407 of the boost converter 405 to generate the desired current waveform.

The estimators disclosed above are designed for operation at a specific frequency of the input AC signal. It may be desirable, however, to provide for operation at differing frequencies with a single circuit pack.

Figure 5:
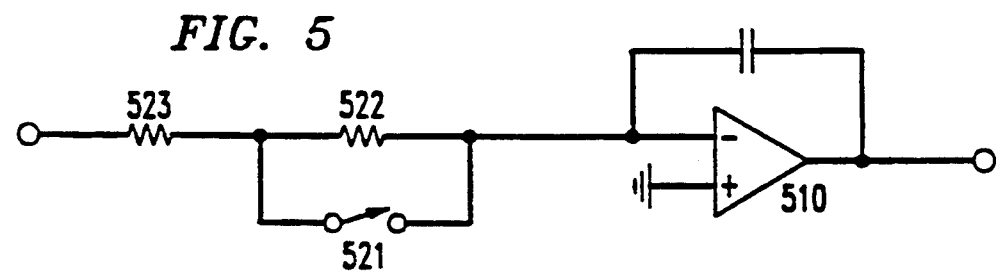
FIG. 5 is a schematic of an integrator which may be used in the circuit of FIG. 1 to accommodate two input line frequencies.

For rectifiers which may be used in either 50 Hz or 60 Hz applications, the gains of the intergrators 201 and 202 in FIG. 2 need only be selectively set to gains of $2\pi 50$ or $2\pi 60$ respectively. A representative integrator having a step adjustable gain to provide the two gains of $2\pi 50$ and $2\pi 60$ is shown in the FIG. 5. Two series connected input resistors 522 and 523 to the integrator 510 are set to provide the needed gain for a particular frequency of operation. This gain is enabled as a selectable gain for the integrator circuitry 510, in FIG. 5, by using a switch 521 which shorts an input resistor 522. The switch 521 is opened for 50 Hz operation, and closed for 60 Hz operation.

Figure 6:
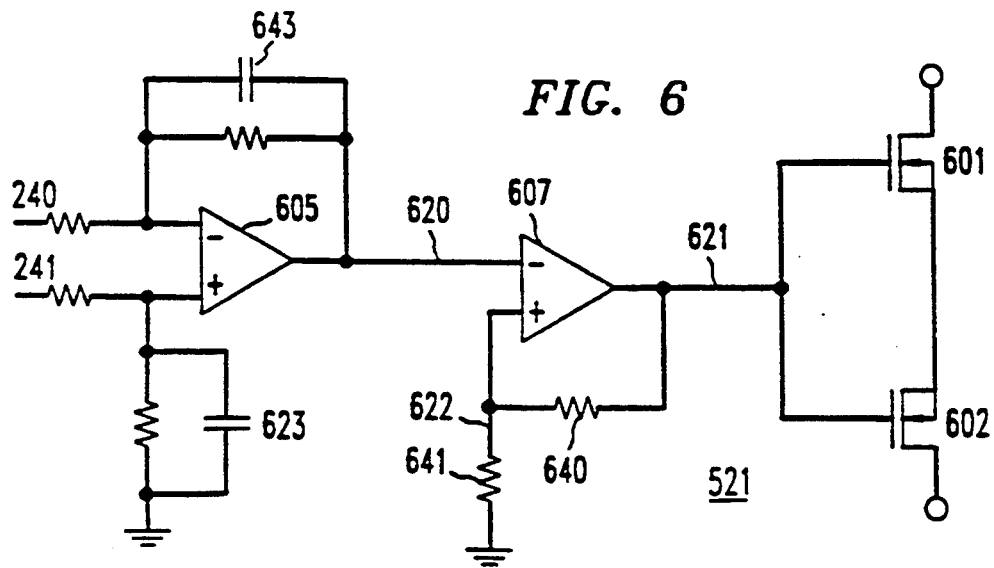
FIG. 6 is a schematic of circuitry for enabling the circuits used as the integrators in FIG. 1, to respond automatically to different frequency inputs.

The switch 521 is implemented, in the illustrative embodiment, by two series-connected but oppositely poled FETs 601 and 602 as shown in FIG. 6. FIG. 6 shows a representative controller to replace the integrator 225 shown in FIG. 2. It operates in response to the outputs 131 and 132 of the squarers 115 and 117 shown in FIG. 1 to control the gates of FETs 601 and 602. An operational amplifier 605 provides the desired gain $R_{2a}/R_{1a} = R_{2b}/R_{1b}$ to provide an output voltage on lead 620 which is representative of the frequency error of the estimating circuit of FIG. 1 with respect to the input frequency of $E_m$ sin ($\omega$t). A typical gain for operational amplifier 605 would be minus one volt per hertz. If switches 601 and 602 are open for 50 Hz operation and if a 60 Hz input voltage waveform is applied to the estimator, then a $-10$ V output appears on lead 620 from operational amplifier 605. Capacitors 643 and 623 in FIG. 6 may be selected to provide a response time of one second or more, taking advantage of the fact that the input frequency rarely is suddenly changed.

The operation of the circuit in FIG. 6 can be described as follows. If the estimator on FIG. 1 has been operating at 50 Hz, then the voltage of lead 621 is approximately $-15$ volts and the voltage on lead 620 is near zero. The voltage on lead 622 is $-5$ volts as determined by the ratio of the resistor divider 640 and 641. Switches 601 and 602 are both open (i.e. the FETs are nonconducting).

If the AC input frequency changes to 60 Hz, then the voltage from squarer 117 (i.e. lead 132) is smaller than that from 115 (i.e. lead 131), and the voltage on lead 620 falls to $-10$ volts. This voltage represents a $+10$ Hz frequency error. The comparator 607 switches its output voltage on lead 621 to +15 volts, closing switches 601 and 602 (i.e. the FETs are conducting), and the voltage on lead 620 returns to nearly zero. The voltage on lead 622 is +5 volts, maintaining the comparator 607's output voltage, on lead 621, at +15 volts.

More elaborate circuits controlling the gains of integrators 201 and 202 to accommodate continuously varying input frequencies can be developed for use in conjunction with the circuit on FIG. 2 by adjusting the gains of the integrators 201 and 202 using either multiplying digital-to-analog converters or fully analog multipliers such as those based on Gilbert multiplier cells. Microprocessor controllers can also be used to provide an effective way to implement controllers with continuously variable input frequencies.

Figure 7:
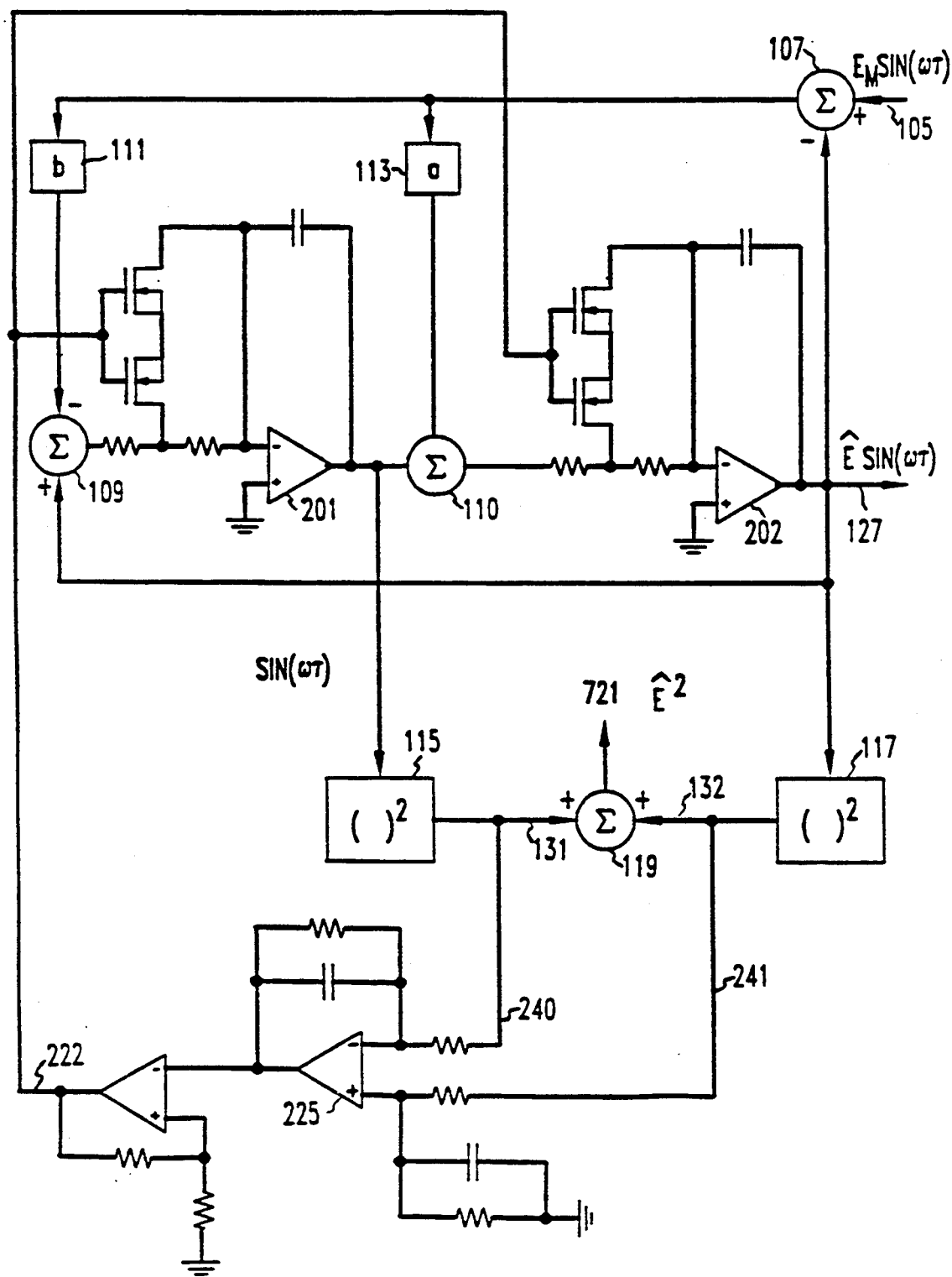
FIG. 7 is a schematic of an estimating circuit incorporating the circuitry of FIG. 6 to allow it to automatically select the gain of the integrators for different frequency inputs.

An illustrative estimator fully capable of operating in 50 Hz and 60 Hz environments is shown in the schematic of FIG. 7. The estimating circuit is essentially the circuit of FIG. 1 which has been modified by the circuitry of FIG. 6. Its operation is evident from the discussion above describing the schematics of FIG. 1 and 6. It includes the outputs 721 to provide the peak squared voltage and the output 727 to provide a sine wave voltage at the fundamental frequency.

We claim:

1. An estimating circuit for deriving a squared signal value from a substantially sinusoidal waveform signal; comprising:
    first and second integrators series connected with each other in a substantially closed loop with an output of the first integrator connected to an input of the second integrator and an output of the second integrator connected to an input of the first integrator;
    a first summing circuit including a first input for accepting the substantially sinusoidal waveform signal and a second input connected to receive an output of the second integrator;
    means for coupling an output of the first summing circuit into the closed feedback loop connecting to the second integrator;
    a first and a second signal level squaring circuit connected to square the signal output of the first and second integrators, respectively; and
    a second summing circuit for combining the signal outputs of the first and second signal level squaring circuits and an output for supplying a squared value of the input substantially sinusoidal waveform signal.

2. An estimating circuit for deriving a squared signal value from a substantially sinusoidal waveform signal; comprising:
    first and second integrators series connected with each other in a substantially closed loop with an output of the first integrator connected to an input of the second integrator and an output of the second integrator connected to an input of the first integrator;
    a first summing circuit including a first input for accepting the substantially sinusoidal waveform signal and a second input connected to receive an output of the second integrator;
    means for coupling an output of the first summing circuit into the closed feedback loop interconnecting the first and second integrator;
    a first and a second signal level squaring circuit connected to square the signal output of the first and second integrators, respectively; and
    a second summing circuit for combining the signal outputs of the first and second signal level squaring circuits and an output for supplying a squared value of the input substantially sinusoidal waveform signal.

3. An estimating circuit for deriving a squared signal value from a substantially sinusoidal waveform signal; as claimed in claims 1 or 2 and further comprising:
    first means for inserting gain in the means for coupling an output of the first summing circuit into the closed loop between the first and second integrator at an input to the first integrator;
    second means for inserting gain in the means for coupling an output of the first summing circuit into the closed loop between the first and second integrators at an input to the second integrator.

4. An estimating circuit for deriving a squared signal value from a substantially sinusoidal waveform signal; as claimed in claim 3 and further comprising:
    the first and second means for inserting gain include a gain source and a summing circuit connected within the feedback loop.

5. An estimating circuit for deriving a signal value representing a frequency of a fundamental of a substantially sinusoidal waveform signal comprising:
    first and second integrators series connected with each other in a substantially closed loop with an output of the first integrators connected to an input of the second integrator and an output of the second integrator connected to an input of the first integrator;
    a first summing circuit including a first input for accepting the substantially sinusoidal waveform signal and a second input connected to receive an output of the second integrator;
    means for coupling an output of the first summing circuit to an input of at least one of the first and second integrator;
    a first and a second signal level squaring circuit connected to square the signal output of the first and second integrators, respectively; and
    a third integrator connected to accept an output of the first and second level squaring circuits and deriving a value of frequency for a fundamental of the substantially sinusoidal waveform signal.

6. A method of estimating a peak signal value from a substantially sinusoidal waveform signal; comprising the steps of:
    integrating the sinusoidal waveform signal to generate a first integral value;
    integrating the first integral value to generate a second integral value; squaring the first integral value to generate a first squared value; squaring the second integral value to generate a second squared value; summing the first squared value with the second squared value to generate a non-periodic magnitude representative of the substantially sinusoidal waveform signal.

7. A method of estimating a peak signal value from a substantially sinusoidal waveform signal as claimed in claim 6; further comprising the steps of:
    amplifying the substantially sinusoidal waveform signal with controlled gain preceding its first integration step.

8. A method of estimating a peak signal value from a substantially sinusoidal waveform signal as claimed in claim 6; further comprising the steps of:

combining and integrating the first and second squared values to generate a value representative of a fundamental frequency of the substantially sinusoidal waveform signal.

9. A method of estimating a peak signal value from a substantially sinusoidal waveform signal as claimed in claim 6; further comprising:

the step of amplifying includes selecting the gain for inserting with a value selected for controlling a desirable circuit admittance of an active power factor enhancing circuit with which the estimating circuit is to cooperate.

10. An estimating circuit for deriving signals representative of an amplitude and frequency of a fundamental of a sinusoidal AC voltage, comprising:

an input for accepting the sinusoidal AC voltage;

first and second integrators series connected with each other in a closed loop with an output of the first integrator connected to an input of the second integrator and an output of the second integrator connected to an input of the first integrator;

the first and second integrators having first and second controllable input impedances respectively;

means for coupling the input for accepting the sinusoidal AC voltage into the closed loop;

a first and a second signal level squaring circuit connected to square the signal output of the first and second integrators, respectively; and control circuitry responsive to outputs of the first and second signal level squaring circuits and connected to control the first and second controllable input impedances to accommodate frequency changes of the sinusoidal AC voltage at the input.

* * * * *